United States Patent
Hurrell et al.

(10) Patent No.: US 10,931,122 B2
(45) Date of Patent: Feb. 23, 2021

(54) PRE-CHARGING CIRCUITRY FOR MULTIPLEXER

(71) Applicant: Analog Devices International Unlimited Company, Hamilton (BM)

(72) Inventors: Christopher Peter Hurrell, Cookham (GB); Sanjay Rajasekhar, Newbury (GB)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 122 days.

(21) Appl. No.: 15/375,906

(22) Filed: Dec. 12, 2016

(65) Prior Publication Data
US 2018/0167067 A1    Jun. 14, 2018

(51) Int. Cl.
H03K 17/693    (2006.01)
H03K 17/00    (2006.01)
H03K 17/0416    (2006.01)
H02J 7/00    (2006.01)
H02J 7/34    (2006.01)

(52) U.S. Cl.
CPC ............ *H02J 7/0013* (2013.01); *H02J 7/345* (2013.01); *H03K 17/005* (2013.01); *H03K 17/0416* (2013.01); *H03K 17/693* (2013.01)

(58) Field of Classification Search
None
See application file for complete search history.

(56) References Cited

U.S. PATENT DOCUMENTS 8,994,564 B2 * 3/2015 Hurrell ............... G11C 27/02
341/122
9,548,948 B2 * 1/2017 Mora Puchalt ....... H03M 1/124
(Continued)

FOREIGN PATENT DOCUMENTS

JP    H02280530    11/1990
JP    2000516075    11/2000
(Continued)

OTHER PUBLICATIONS

"Analog Devices Circuit Note CN-0385", (2016), 13 pgs.
(Continued)

*Primary Examiner* — Lincoln D Donovan
*Assistant Examiner* — Colleen J O Toole
(74) *Attorney, Agent, or Firm* — Schwegman Lundberg & Woessner, P.A.

(57) ABSTRACT

A pre-charge circuit is provided for pre-charging the input node of a capacitive component to which the multiplexer output is fed to a charge level that is close to or approximates the signal output level of the multiplexer when its output is next switched. In order to reduce the level shifting burden on the amplifier in the pre-charge circuit, each pre-charge circuit input channel has a respective capacitor that is able to be switched in and out of series with the respective multiplexer channels, such that the respective capacitors track the signal levels on the multiplexer channels. The provision of the corresponding capacitors for each MUX channel reduces the input current to the pre-charge amplifier, and allows for the level shifting burden to be taken by the capacitors, leading to more stable and lower power operation.

23 Claims, 12 Drawing Sheets

(56) References Cited

U.S. PATENT DOCUMENTS

| | | | |
|---|---|---|---|
| 9,571,118 B1* | 2/2017 | Gupta | H03M 1/1245 |
| 9,960,782 B2* | 5/2018 | Stulik | H02M 3/07 |
| 2014/0079079 A1 | 3/2014 | Mora Puchalt et al. | |

FOREIGN PATENT DOCUMENTS

| | | |
|---|---|---|
| JP | 2005210182 | 8/2005 |
| JP | 2014528679 | 10/2014 |
| JP | 2015128203 | 7/2015 |

OTHER PUBLICATIONS

"Analog Devices Data Sheet AD4000/AD4004/AD4008", (2016), 36 pgs.

"Analog Devices Precision SAR ADCs User Guide", (2016), 26 pgs.

"Japanese Application Serial No. 2017-237631, Notification of Reasons for Rejection dated Jul. 22, 2019", w/ English Translation, 8 pgs.

\* cited by examiner

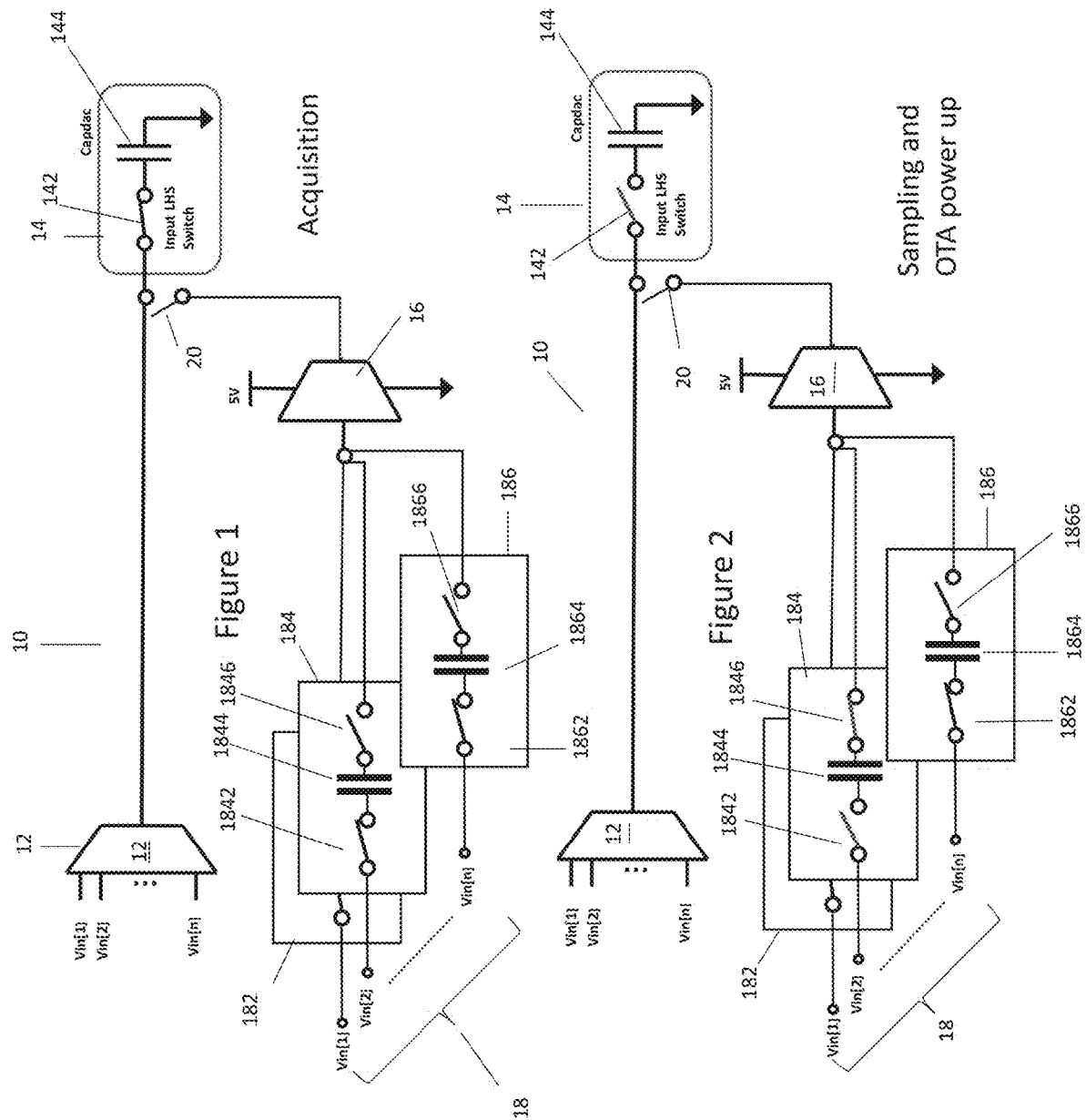

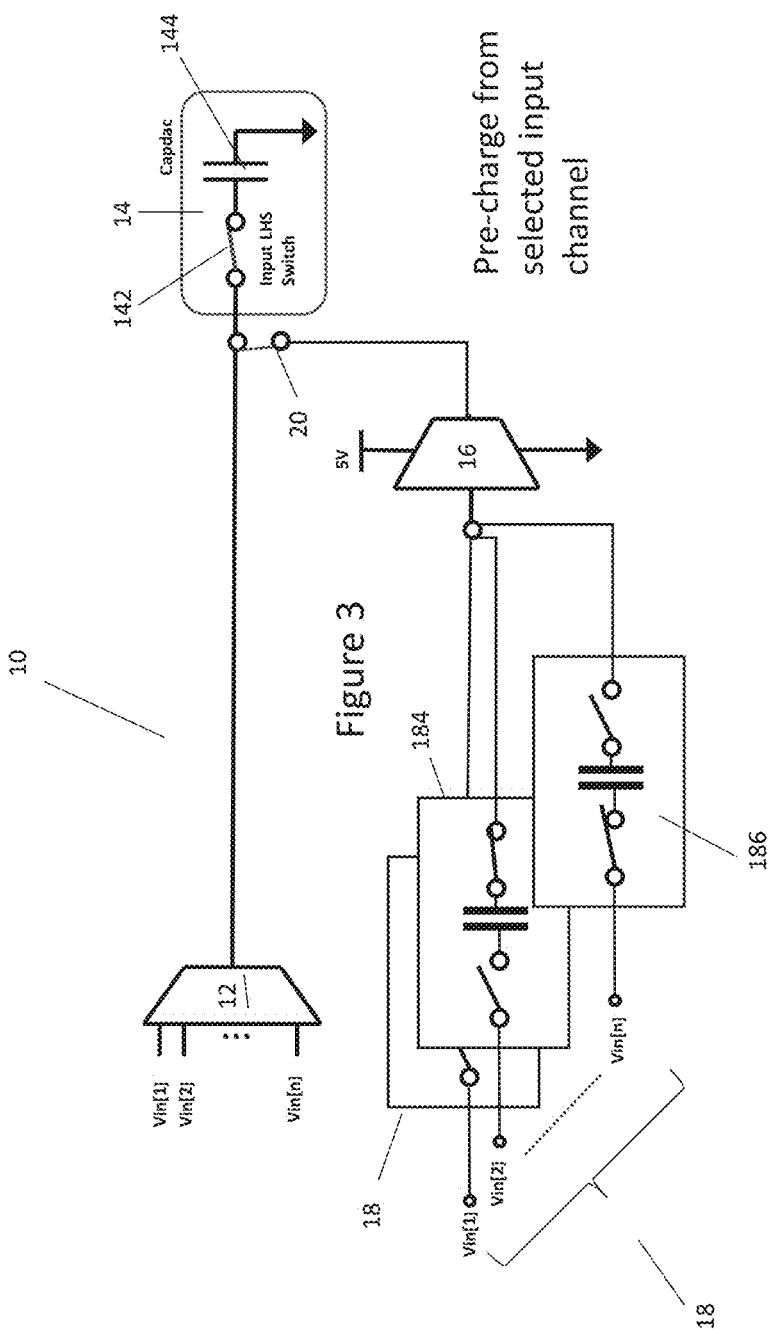

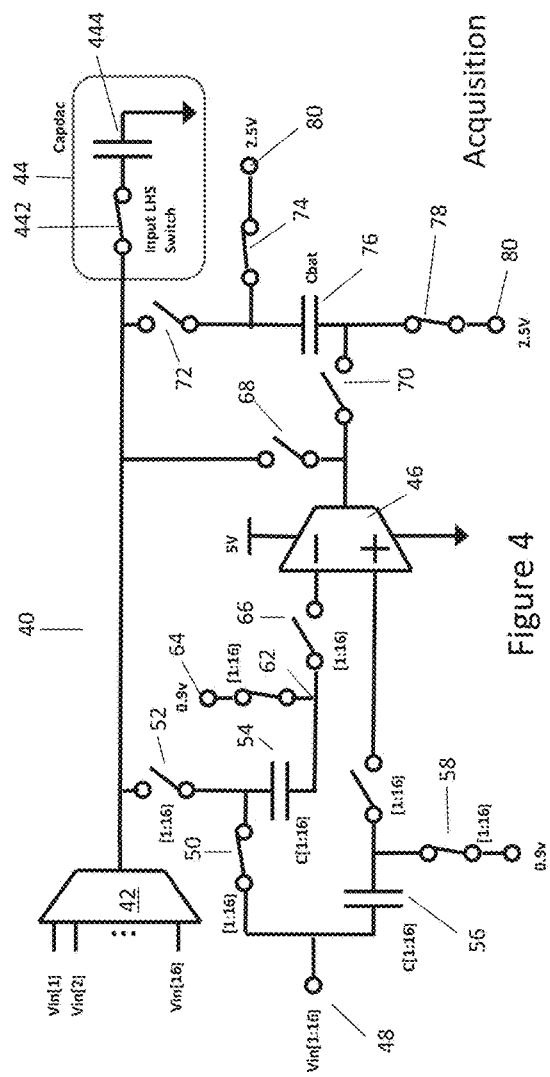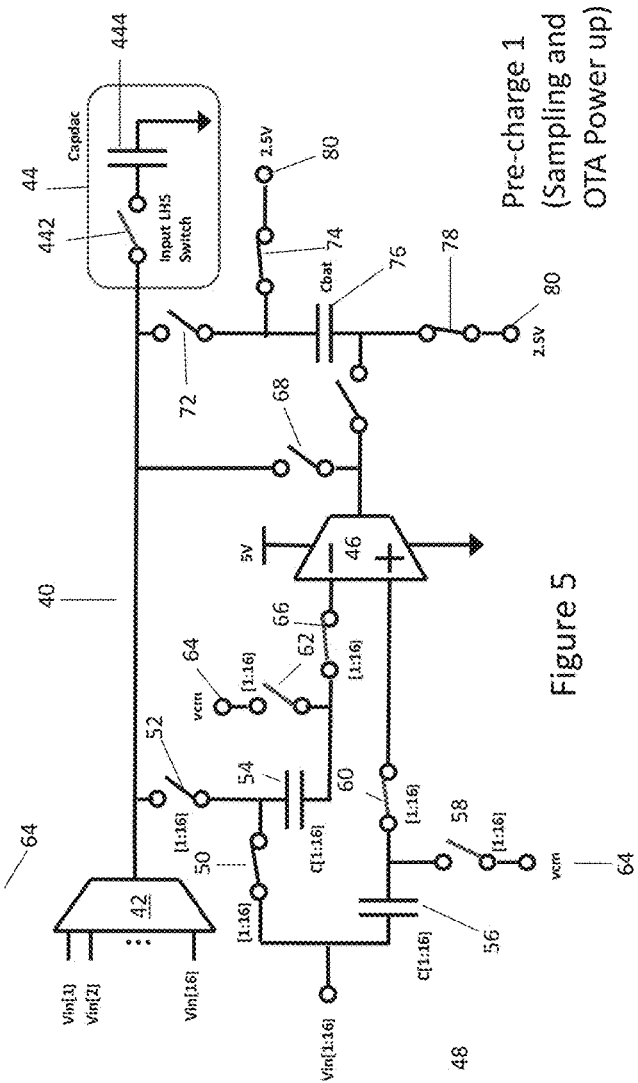

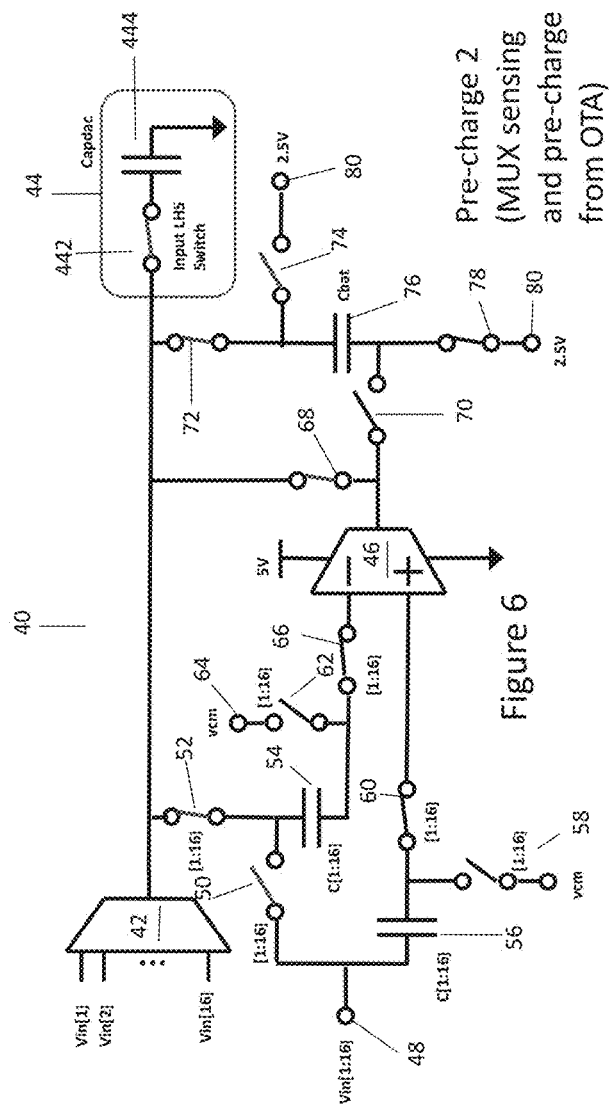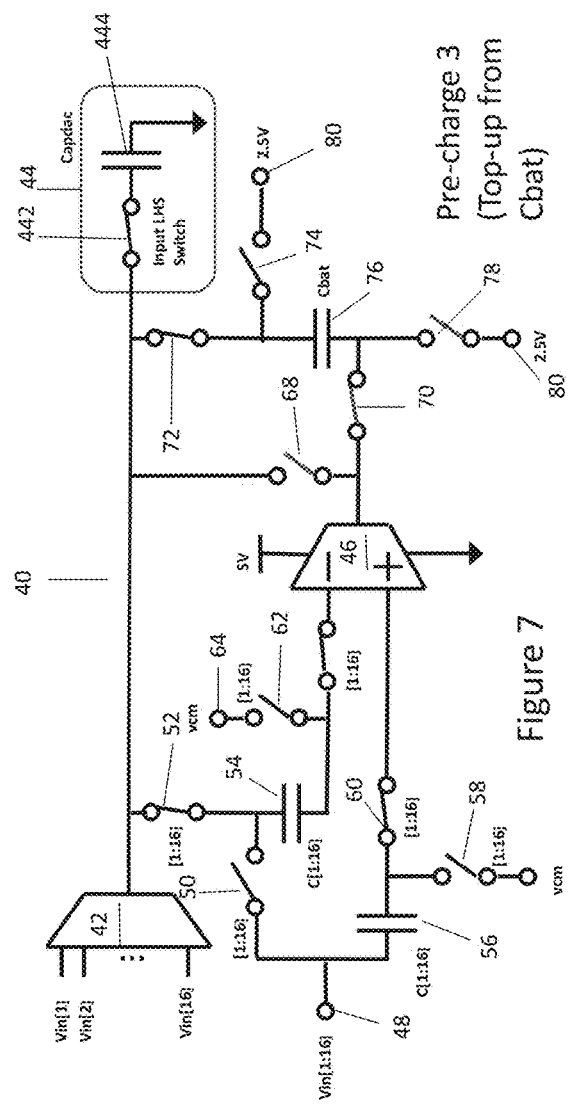

PRE-CHARGING CIRCUITRY FOR MULTIPLEXER

FIELD OF THE DISCLOSURE

The present disclosure relates to a pre-charging circuit that pre-charges a capacitive node to which the output of a multiplexer is to be switched to allow faster charge settling times at the capacitive node after multiplexer channel switching has occurred.

BACKGROUND

When the output of a multiplexer (MUX) is switched so as to be connected to a capacitive node (such as the input node of a switched capacitor digital-to-analog converter (DAC) that forms part of an analog-to-digital converter (ADC)), charge redistribution may need to occur to drive the capacitive node to be the same voltage as the output of the MUX. For example if the capacitive node was connected in an immediately previous MUX cycle to a MUX channel having a low voltage output signal, and the MUX then switches so as to output a MUX channel having a high voltage output to the capacitive node, electrical charge must flow from the MUX output to the capacitive node to charge the capacitive node to bring it up to the high voltage level of the present MUX output. This flow of charge is not instantaneous and takes a finite amount of time, limiting MUX channel switching times and circuit throughput. One way to reduce the amount of time taken is to pre-charge the capacitive node to a level approximate to that of the next MUX channel to be selected, before the next MUX channel is switched in series, using a suitably controlled pre-charging amplifier. However, such amplifiers can experience operational difficulties in having to deal with the full range of possible input signals that may be present on different MUX channels, in that they may not be capable of fast-enough rail to rail output level shifting, or be able to drive the capacitive node through rail to rail voltage ranges.

SUMMARY OF THE DISCLOSURE

In some examples of the present disclosure a pre-charge circuit is provided for pre-charging the input node of a capacitive component to which the multiplexer output is fed to a charge level that is close to or approximates the signal output level of the multiplexer when its output is next switched. In order to reduce the level shifting burden on the amplifier in the pre-charge circuit, each pre-charge circuit input channel has a respective capacitor that is able to be switched in and out of series with the respective multiplexer channels, such that the respective capacitors track the signal levels on the respective channels. The provision of the corresponding capacitors for each MUX channel reduces the input current to the pre-charge amplifier, and allows for the level shifting burden to be taken by the capacitors, leading to more stable and lower power operation.

In view of the above, an example described herein provides a multiplexing circuit having pre-charge circuitry for pre-charging a capacitive load to which a multiplexer provides a signal. The multiplexing circuit may comprise a multiplexer having a plurality of input channels and an output channel, a capacitive load connectable to the output channel of the multiplexer, and pre-charge circuitry arranged in use to pre-charge the capacitive load in dependence on a signal on one of the input channels to the multiplexer to be next output to the capacitive load. The pre-charge circuitry may further comprise a first amplifier arranged to provide a first pre-charging signal to the capacitive load to pre-charge the load, a plurality of capacitors switchable so as to track respectively the plurality of input channels to the multiplexer, and first switching circuitry controllable to switch into series with the first amplifier input the respective capacitor that tracks the input channel to the multiplexer to be next output. As noted above, the provision of the capacitors means that the first amplifier does not need to deal with as great signal level changes as would otherwise be the case, leading to stable and power efficient operation.

In an example the respective capacitor has sampled the signal on the input channel next to be output from the multiplexer when it is switched into series with the first amplifier input.

In a further example, two or more capacitors are provided respectively per input channel to the multiplexer, the two or more capacitors per channel being switchable so as to track respectively the input channels of the multiplexer. The provision of two capacitors per channel allows the next input channel to be output by the multiplexer to be tracked all the way through the pre-charging phase, so that the pre-charge may be as accurate as possible.

In an example where two capacitors are provided, the first amplifier is a differential amplifier having respective first and second differential inputs, one of the two or more capacitors per input channel being connectable via the switching circuitry between the respective multiplexer input channel for the capacitor and the first differential input of the first amplifier, and the other of the two or more capacitors being connectable via the switching circuitry between: i) in a first phase of operation, the respective multiplexer input channel for the capacitor; or ii) in a second phase of operation, the multiplexer output channel; and the second differential input of the first amplifier. As noted above, the connections of such capacitors allows one of the capacitors to track the next input node to be output by the MUX throughout the pre-charge phase, whilst the other capacitor senses the charge on the MUX output line, thereby permitting accurate control of the charge supplied by the first amplifier.

Within the above example, in a further example in the first phase of operation both the capacitors track the respective multiplexer input channel to be next output, and hence the first amplifier outputs no pre-charging signal to the capacitive load, and in the second phase of operation where one of the capacitors tracks the respective multiplexer input channel and the other of the capacitors tracks the multiplexer output channel the first amplifier outputs the pre-charging signal in dependence on any difference in signal between the multiplexer output channel and the respective multiplexer input channel to be next output. Such operation ensures that the multiplexer output channel is accurately pre-charged to the level of the signal next to be output from the multiplexer.

In this respect, in the above example at the moment of switching between the first and second phases of operation the other of the two capacitors that switches between tracking the respective next multiplexer input channel and the multiplexer output channel is charged to the signal level of the respective next multiplexer input channel.

In an example the first amplifier undertakes an auto-zero calibration process during power-up. Such a calibration process ensures that the amplifier will provide precision operation. In an example the auto-zero calibration process takes place during the first phase of operation described above when both the capacitors track the respective multiplexer input channel to be next output, and no output is required from the first amplifier.

In a further example a battery capacitor switchable into series between the output of the first amplifier and the capacitive load may be provided. The battery capacitor can act to help the first amplifier in charging the capacitive load to the necessary signal level when the desired signal level is near to the first amplifier supply rail voltages.

In an example, second switching circuitry may be provided arranged to, in a third phase of operation, switch the battery capacitor so as to provide a parallel load to the capacitive load to the first amplifier, wherein to permit the first amplifier to charge the battery capacitor in parallel with the capacitive load. A fourth phase of operation is then further undertaken, where the second switching circuitry acts to switch the battery capacitor in series between the first amplifier output and the capacitive load. Such operation permits the battery capacitor to first be charged by the first amplifier, and then to supplement the amplifier output signal to pre-charge the capacitive load.

In an additional or alternative example second switching circuitry may be provided arranged to switch the battery capacitor in series between the first amplifier output and the capacitive load. Again, such operation permits the battery capacitor to supplement the first amplifier output signal to pre-charge the capacitive load, and permits the first amplifier to be fed by a lower voltage supply. In such an example the battery capacitor will typically be switched to be charged from supply voltage nodes before it is called into operation.

In a further example second pre-charge circuitry that mirrors the first pre-charge circuitry is provided. In this example the second pre-charge circuitry may further comprise a second amplifier arranged to provide a second pre-charging signal to the capacitive load to pre-charge the load, a plurality of capacitors switchable so as to track respectively the plurality of input channels to the multiplexer, and second switching circuitry controllable to switch into series with the second amplifier input the respective capacitor that tracks the input channel to the multiplexer to be next output. The provision of the second pre-charge circuitry allows the pre-charging phase to be split into two separate phases, with dedicated amplifiers specific to the requirements of each phase.

In this respect, in an example the second amplifier provides the second pre-charging signal to the capacitive load before the first amplifier provides the first pre-charging signal to the capacitive load. Moreover, in a further example the second pre-charging signal is larger than the first pre-charging signal, whereby a two-stage pre-charging operation is obtained. With such examples, the first and second amplifiers may be designed to be power efficient for the pre-charging tasks they respectively have to perform. For example, the second amplifier may provide a larger, yet coarser, non-precision, pre-charge signal to bring the output of the MUX most of the way to the desired signal level, with the first amplifier then being more precisely controlled to finalise the pre-charge to the desired signal level, but by having to provide less charge in doing so due to the action of the coarse second amplifier.

In another example described herein there is also provided a further multiplexing circuit having pre-charge circuitry for pre-charging a capacitive load to which a multiplexer provides a signal. In this example the pre-charge circuitry further comprises a first amplifier arranged to provide a first pre-charging signal to the capacitive load to pre-charge the load, and a battery capacitor switchable into series between the output of the first amplifier and the capacitive load to provide a top-up pre-charging signal to the capacitive load. As explained previously in respect of an earlier example, the provision of a battery capacitor helps the first amplifier to pre-charge the capacitive load to levels that may be at or near to the supply voltage rails of the amplifier, and that otherwise the amplifier may find difficult to achieve in a timely fashion on its own.

A further example described herein provides a method of operating a multiplexing circuit having pre-charging circuitry for pre-charging a capacitive load to which a first multiplexer provides a signal. The method comprises tracking, via a plurality of respective capacitors, the signals on a plurality of input channels to the first multiplexer, and then selecting one of the input channels to be next output by the first multiplexer. The signal on the selected channel is then fed, via the respective capacitor(s) that track(s) the selected channel, to a first amplifier, where it is used to generate a first pre-charge signal in dependence on the signal received at the first amplifier via the respective capacitor(s). The pre-charge signal is then fed to the capacitive load to pre-charge the capacitive load prior to the selected input channel being output by the first multiplexer.

Moreover, a further example method based on the above may further comprise generating, in a second amplifier, a second pre-charge signal in dependence on a signal received at a second amplifier corresponding to the signal on the selected channel to be next output by the first multiplexer, and feeding the second pre-charge signal to the capacitive load to pre-charge the capacitive load prior to the first pre-charge signal being fed to the capacitive load. In this example the second pre-charge signal is larger than the first pre-charge signal, whereby a coarse pre-charge of the capacitive load is obtained followed by a fine pre-charge.

Further features, embodiments, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:—

FIG. 1 is a circuit block diagram of a first example of the present disclosure, in a first mode of operation;

FIG. 2 is a circuit block diagram of the first example of the present disclosure, in a second mode of operation;

FIG. 3 is a circuit block diagram of the first example of the present disdosure, in a third mode of operation;

FIG. 4 is a circuit diagram of a second example of the present disclosure in a first mode of operation;

FIG. 5 is a circuit diagram of the second example of the present disclosure in a second mode of operation;

FIG. 6 is a circuit diagram of the second example of the present disclosure in a third mode of operation;

FIG. 7 is a circuit diagram of the second example of the present disclosure in a fourth mode of operation;

DETAILED DESCRIPTION

Figure 8A:
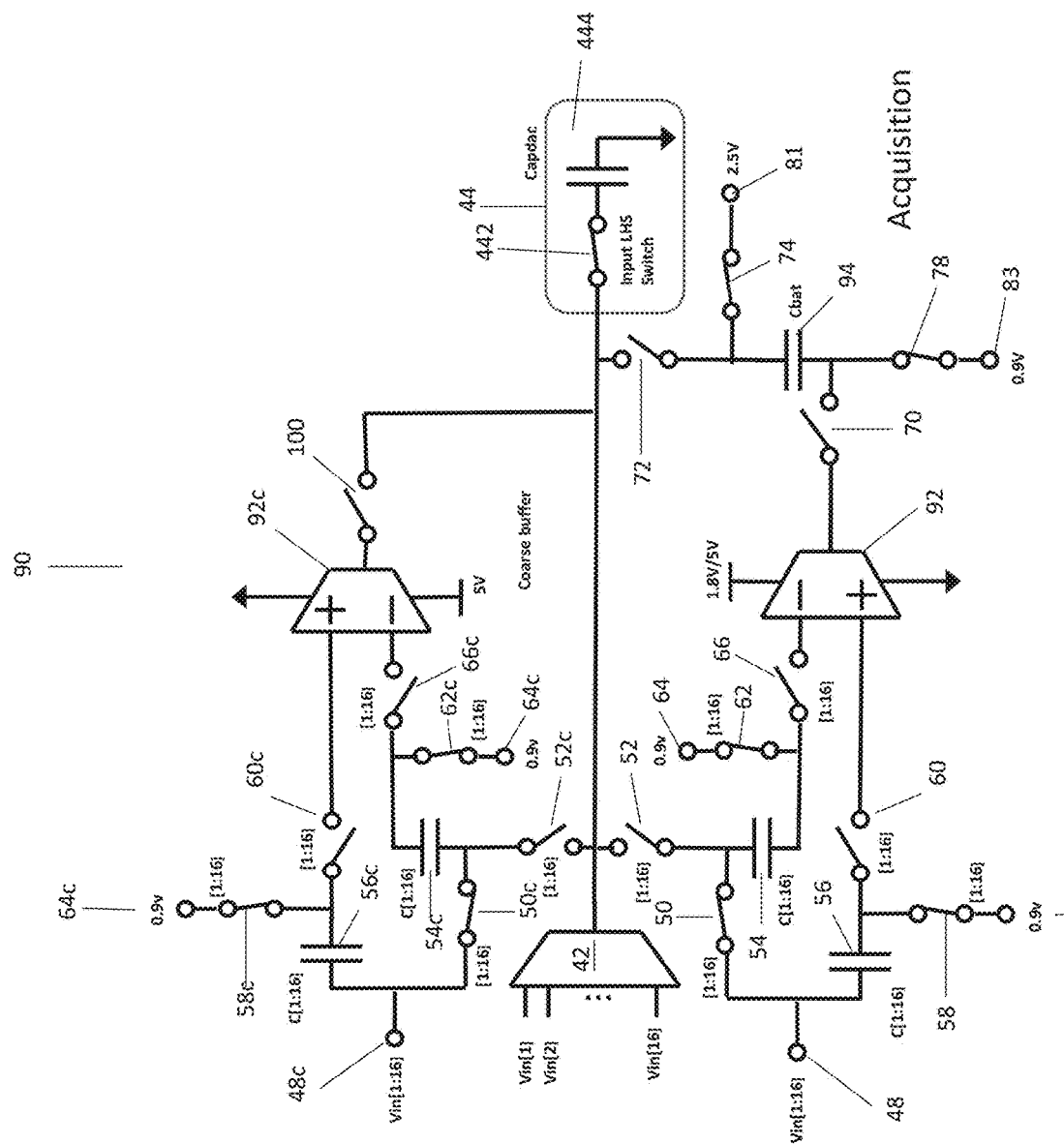
FIG. 8*a* is a circuit diagram of a third example of the present disclosure in a first mode of operation.

In an example of the present disclosure a pre-charge circuit is provided that is intended to pre-charge the input node of a capacitive component to which the multiplexer output is fed (or alternatively the output node of the multiplexer, where it is different) to a charge level that is close to or approximates the signal output level of the multiplexer when its output is next switched. In order to reduce the level shifting burden on the amplifier in the pre-charge circuit, the pre-charge circuit is provided with a corresponding number of input channels to the number of MUX channels, with the pre-charge circuit input channels being connected to the same input nodes as the input channels of the MUX, such that the same respective signals Vin[1], Vin[2], . . . , Vin[n] appear thereon. Each pre-charge circuit input channel has a respective capacitor that is able to be switched in and out of series with the respective input node, such that the respective capacitors track the signal levels on the input nodes. When a MUX channel is to be output to the capacitive node, the corresponding pre-charge circuit input channel is selected and the respective capacitor thereon switched into series with the pre-charging circuit amplifier. The pre-charging circuit amplifier is a first transconductance amplifier, that outputs a current in dependence on the voltage held on the capacitor, the output current being fed to the input node of the capacitive component to which the output of the MUX is to be fed, in order to pre-charge the node so as to be at or approximately at the same signal charge level as the signal to be output from the MUX. The provision of the corresponding capacitors for each MUX channel reduces the input current to the pre-charge amplifier, and allows for the level shifting burden to be taken by the capacitors. This in turn allows the pre-charge amplifier to work with similar or identical signal input levels from sample to sample, leading to more stable and lower power operation.

In a further example, in addition to providing the respective input capacitors to the transconductance amplifier, an efficient coarse buffer amplifier may also be provided, which has a corresponding input circuit to that of the aforementioned first transconductance amplifier, having switched capacitors connectable to the input channels Vin[1], Vin[2], . . . Vin[n]. The coarse buffer amplifier is used to pre-charge the capacitive node to a signal level approximately the same as the next MUX output whilst the first transconductance amplifier is powered up, and then the first transconductance amplifier in the pre-charge circuit completes the pre-charge in the same manner as described above. By providing such a two-stage "coarse" and then "fine" pre-charge process in this manner, the pre-charge circuitry can consume less power, in that the first transconductance amplifier need only deal with even smaller pre-charge errors, and hence may require a lower power supply.

A first example of the present disclosure will now be described with respect to FIGS. 1 to 3, to further describe and illuminate the above described operation. In FIG. 1 a multiplexed sampling circuit 10 is provided, having a multiplexer (MUX) 12 receiving multiple respective input channels Vin[1], Vin[2], . . . , Vin[n]. The multiplexer 12 operates to select one of the input channels and switch the signal on the selected input channel to the single MUX output. Connected to the MUX output node is a capacitive load, which in this example is a switched capacitor DAC array 14 (capdac), forming part of an analog to digital converter (ADC). The capdac 14 comprises an input switch 142, in series with the switched capacitor array 144, with the output of the MUX connected to the input switch 142, which switches the MUX output to the switched capacitor array 144.

One issue that affects the speed of operation of such a sampling circuit 10 is the charge settling time of the input node of the capdac 14 when the output of the MUX 12 is switched to a different channel. In this respect, consider the situation when the MUX is outputting an input channel that has a low voltage to the capdac for sampling. In this case, the charge on the input node of the capdac 14 will also be relatively low, representing the low voltage signal on the presently output MUX channel. Consider next that the MUX then switches to a channel on which is present a higher voltage signal, and outputs that higher voltage. In order to bring the input node of the capdac up to that higher voltage for sampling charge must flow from the MUX to the capdac to charge the capdac input node to the higher voltage. Such a flow of charge takes a finite amount of time, reducing the speed of operation and throughput of the sampling circuit.

This problem is exacerbated when the MUX 12 output is intermittent, or has periods when the output is zero (or whatever the circuit lowest voltage is) between different channels being output, as may be the case during multiplexed ADC operations. In this case the charge swing on the capdac can be even greater from sample to sample, potentially up to the full signal swing range of potential output signals from the MUX 12.

In order to address the above, a pre-charge circuit is provided, to charge the input node of the capdac to a charge level approximate or at that of the next MUX channel to be output from the MUX, before the next MUX channel is switched to be output.

The pre-charge circuit in this example comprises an operational transconductance amplifier (OTA) 16, which receives as an input a signal from a parallel array of capacitors 18, each of the respective capacitors (1844, 1864) capable of being switched in and out of circuit in series with the OTA input by respective capacitor output switches (1846, 1866). Each capacitor (1824, 1844, 1864) also has a corresponding capacitor input switch (1842, 1862), which switches the respective capacitors to connect to the respective input channels Vin[1], Vin[2], Vin[n], being the same input channels as are also input to the MUX 12. As a consequence, each input channel Vin[1], Vin[2], Vin[n] has a corresponding switched capacitor unit 182, 184, 186, with each switched capacitor unit comprising a respective capacitor input switch (1842, 1862) that is connected to the respective input channels and is in series with a respective capacitor (1844, 1864), which is in turn in series with a respective capacitor output switch (1846, 1866). The respective capacitor output switches are all connected to a common node comprising the input of the OTA 16. The output of the OTA 16 is connected, via switch 20, to the input node of the capdac 14, to allow the OTA 16 to pre-charge that node prior to MUX channel switching.

The operation of the above described circuit arrangement is as follows, and shown in FIGS. 1 to 3, and 12. Firstly, consider FIG. 1, which shows an acquisition phase (s.12.2), where the capdac 14 is switched into series with the MUX output 12, i.e. capdac input switch 142 is turned on, such that the capdac can acquire the signal on the MUX output for sampling and subsequent A to D conversion. In this phase, the switch 20 is turned off, so that the pre-charge circuitry is not connected to the input node of the capdac. However, the pre-charge circuitry is not itself dormant, because although the OTA 16 may be powered down during this phase to save power, the switched capacitor units 18 are all switched so that the capacitor input switches 1842, and 1862 are switched on, and the input signals Vin[1]. Vin[2], ..., Vin[n] are being fed to the respective capacitors 1824, 1844, 1864, so that the capacitors track the signals on the input signal channels Vin[1]. Vin[2], Vin[n]. The capacitor output switches 1846, 1866, are all switched off, so no signal is output to the OTA, which is anyway powered down during this phase. With such a configuration all of the capacitors are tracking their respective inputs and are ready to be the next selected input channel for the pre-charge circuitry.

FIG. 2 then illustrates the next phase in the operation, where the next MUX channel to be output is selected and sampled, and the OTA is powered up (s.12.6). In this example, for the sake of illustration consider that the next MUX channel to be output will be channel 2, having signal Vin[2] thereon. In this case, the switched capacitor unit 184 having the second channel as an input thereto is controlled to have its input switch 1842 switched off, as shown, thus freezing the signal Vin[2] on the capacitor 1844 for sampling by the OTA (s.12.4). At the same time, the capacitor output switch of the second switched capacitor unit 184 is turned on, so that the voltage signal on the capacitor can be fed to the OTA when it has completed power up. The other, un-selected, switched capacitor units remain in the same state as previously, with their input switches on and their output switches off, so that their respective capacitors track their respective MUX input channels. Switch 20 is still in this phase turned off so that no pre-charge signal is being fed to the capdac input, but in this phase the input switch 142 of the capdac itself has turned off, so that conversion may proceed in the ADC.

As mentioned previously, some of the advantages of the above described operation and arrangement are due to the provision of the respective switched input capacitors 18, being at least one for each MUX input channel Vin[1], Vin[2], . . . Vin[n]. Having a corresponding capacitor for each MUX input channel reduces the input current to the the pre-charge OTA, and allows for the level shifting burden (from MUX channel to MUX channel) to be handled by the capacitors, rather than directly by the OTA. This allows the OTA to work with similar or identical inputs from sample to sample, thus leading to stable and low power operation.

Once the ADC is ready to take the next sample from the MUX, which in this case will be from MUX channel 2, then immediately prior to the ADC entering acquisition mode again a pre-charge phase is undertaken, as shown in FIG. 3. Here the switch 20 turns on, and the capdac 14 input switch 142 turns on, thus allowing the OTA to output current to charge the input node and capacitors of the capdac 14 to the voltage held on the input capacitor 1844. In this way the capdac is pre-charged (s.12.8) to at least approximately the same signal level as will be output from MUX channel 2 once it is switched so as to be output from the MUX, and charge settling times from the MUX channel switching is significantly reduced. Once pre-charge has occurred, the capdac is then ready to acquire the signal from channel 2, and the circuitry moves back to acquisition mode as shown in FIG. 1, with the MUX 12 outputting channel 2 to the capdac 14. Such completes a whole pre-charge and acquire cycle, which is then repeated from sample to sample.

The example of FIGS. 1 to 3 represents a relatively high level example for the purposes of explanation. Second and third example embodiments, which represent more detailed examples that that of FIGS. 1 to 3, will now be described, with the second more detailed example being shown in FIGS. 4 to 8 and 13, and the third more detailed example being illustrated in FIGS. 9 to 11 and 14.

With reference to FIGS. 4 to 8, in a second example a multiplexed sampling circuit arrangement 40 is provided, having a multiplexer 42, which has in this example 16 input channels, Vin[1] to Vin[16], and a single output channel. The output of the multiplexer 42 is fed to a capdac 44, which comprises an input capdac switch 442, and a switched capacitor array 444, for sampling the output of the multiplexer.

In order to pre-charge the capdac 44 prior to signal acquisition, a pre-charging circuit is provided, centered about operational transconductance amplifier (OTA) 46. To the left hand side of OTA 46, connecting in parallel to the inputs thereto, are parallel sets of circuitry, with one set for each of the 16 MUX channels. One such set of the parallel sets of circuitry is shown in each of FIGS. 4 to 8 for clarity purposes, although the notation on the circuit diagrams indicates the presence of the 16 parallel sets.

Each parallel set of circuitry comprises an input node 48, connected to a respective one of the 16 input channels to the MUX 42. A first capacitor 56 is then connected between the input node 48 and a low voltage (0.9 v, functionally circuit 0 v) node via a first switch 58, and also to the non-inverting input of the OTA 46. A second switch 50 connects between the input node 48, and a first terminal of a second capacitor 54, the first terminal of the second capacitor 54 also being connected via a third switch 52 to the output line of the MUX 42. A second terminal of the second capacitor 54 connects to the inverting input of the OTA 46 via fourth switch 66, and also to a low voltage (0.9 v, again functionally circuit 0 v) node 64 via fifth switch 62. All of the above noted first and second capacitors and first to fifth switches are repeated, with the same connections, in each of the parallel sets of circuitry for each of the MUX channels, and any of the sets may be selected, by virtue of appropriate switch selection, to be switched into the inputs of the OTA.

On the output side of the OTA a single set of output circuitry is provided, comprising a sixth switch 68 connected from the output of the OTA to the output line of the MUX 42, and a seventh switch 70 connected from the output of the OTA to a node to which is connected a lower terminal of a further capacitor, referred to as the battery capacitor Cbat 76. Also connected to that same node is an eighth switch 78, which switches the lower terminal of the battery capacitor 76 to a power supply node 80, at 2.5 v. An upper terminal of the battery capacitor is connected via a ninth switch 74 to a further power supply node 80, also at 2.5 v, and a tenth switch 72 also connects the upper terminal of the Cbat capacitor 76 to the MUX output channel.

The operation of the above circuitry through an acquire—pre-charge—acquire cycle will now be described, with respect to FIGS. 4 to 8 and 13. Assume that a previous (n−1th) sample is being acquired, and that the circuitry 40 is in acquisition mode, as shown in FIG. 4. Here, the MUX 42 is outputting one of the 16 channels on its output line, and this is being fed via closed capdac input switch 442 in the capdac 44 to the switched capacitor array 444 for sampling. The pre-charge circuitry is disconnected from the MUX output line, by virtue of switches 52, 68, and 72 being off (or high impedance when implemented via transistors). Within the pre-charge circuitry the OTA 46 is powered down to save power, and its output isolated from the MUX output line via the switch 68 being off. The Cbat 76 is also isolated in this phase from both the output of the OTA 46 and also from the MUX output line, by virtue of both switches 70 and 72 being off. In this respect, during acquisition both terminals of the Cbat 76 are connected via on switches 74 and 78 to supply terminals 80 supplying the same input voltage (2.5 v) to both terminals of the capacitor. As such, the charge on the Cbat capacitor is held constant, and no current flows into or out of the capacitor.

With respect to the input side of the OTA, during acquisition all parallel sets of OTA input circuitry are maintained in the same state, and for clarity purposes we describe one set of such parallel circuitry only. In this respect, in any one set the switch 52 is off, and hence not sensing the MUX output line. The switch 50 is on, as are switches 62 and 58, which means that both the first and second capacitors 56 and 54 are connected between the respective input node 48 and respective low voltage nodes 64 (held at 0.9 v, effectively circuit 0V), such that both the capacitors track the signal on the input node 48. The switches 60 and 66 are both off, so that the capacitors are not connected to the OTA, which as mentioned is powered down.

Figure 13:
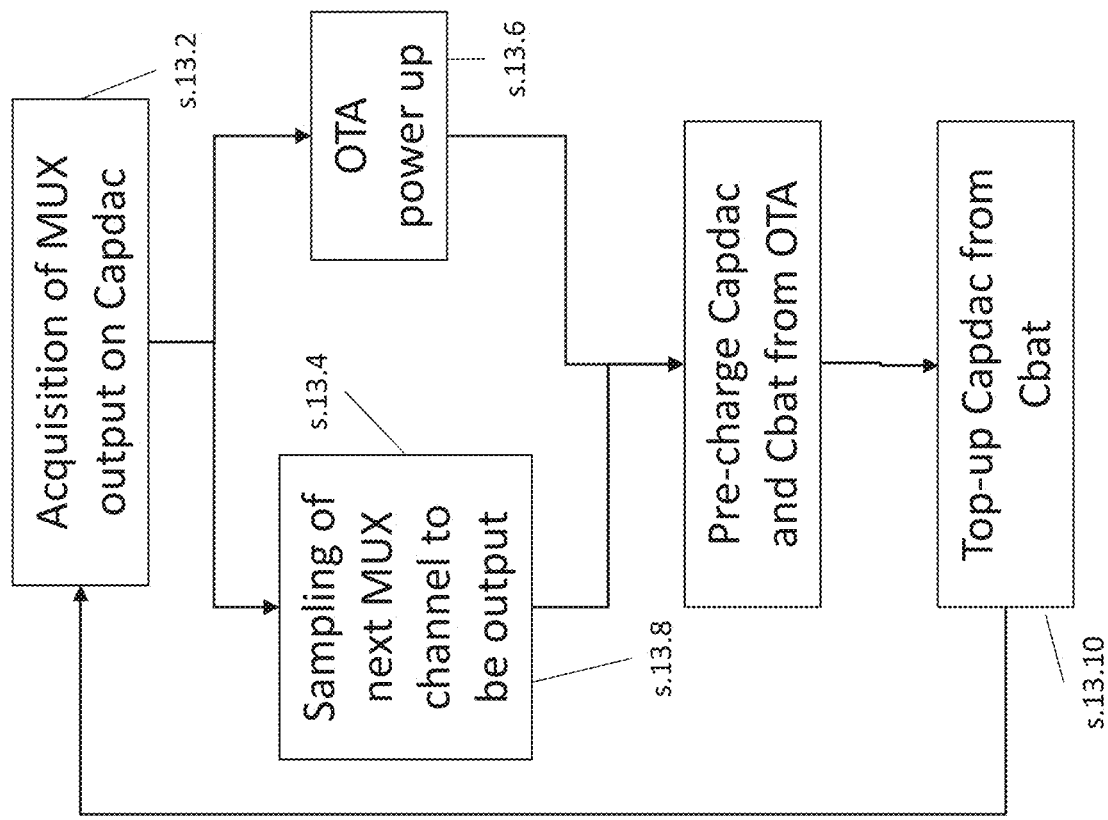
FIG. 13 is a flow diagram illustrating the operation of the second example described herein.
Figure 12:
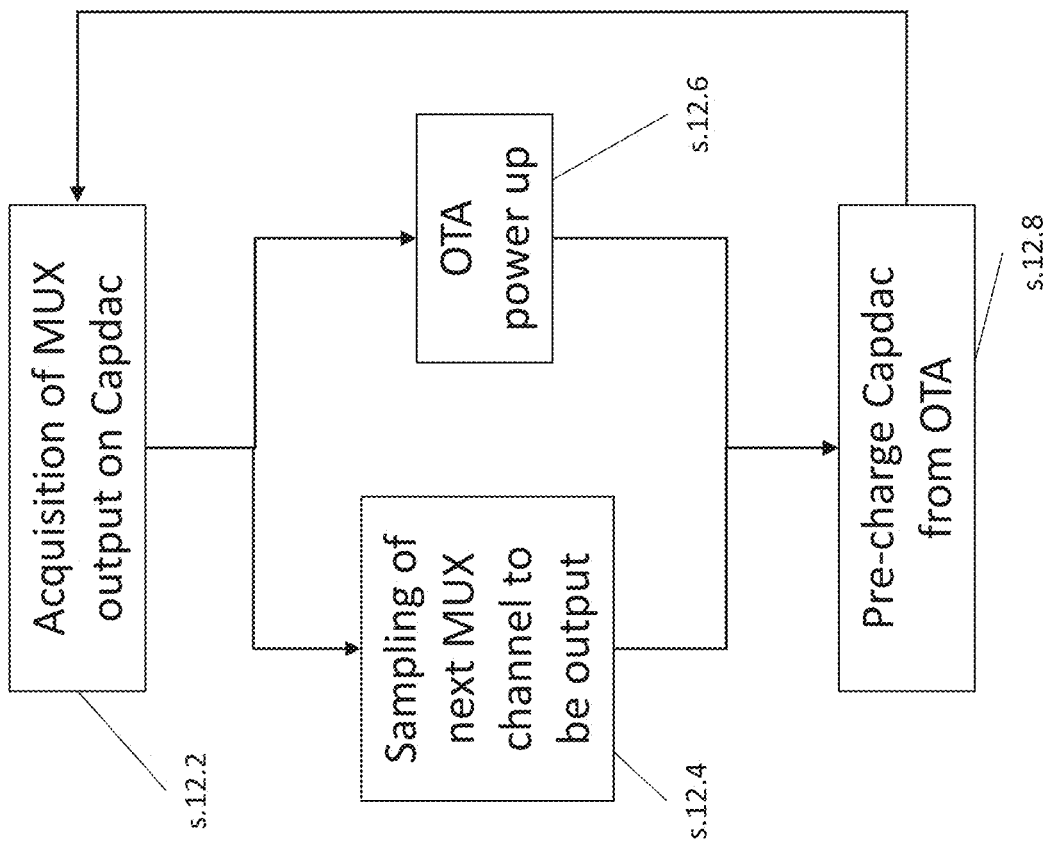
FIG. 12 is a flow diagram illustrating the operation of the first example described herein.

In this state, therefore, and shown as s.13.2 in FIG. 13, the capdac can acquire the signal to be sampled from the MUX, the Cbat is held in a steady state, and the input capacitors 54 and 56 track their respective MUX inputs.

Figure 11:
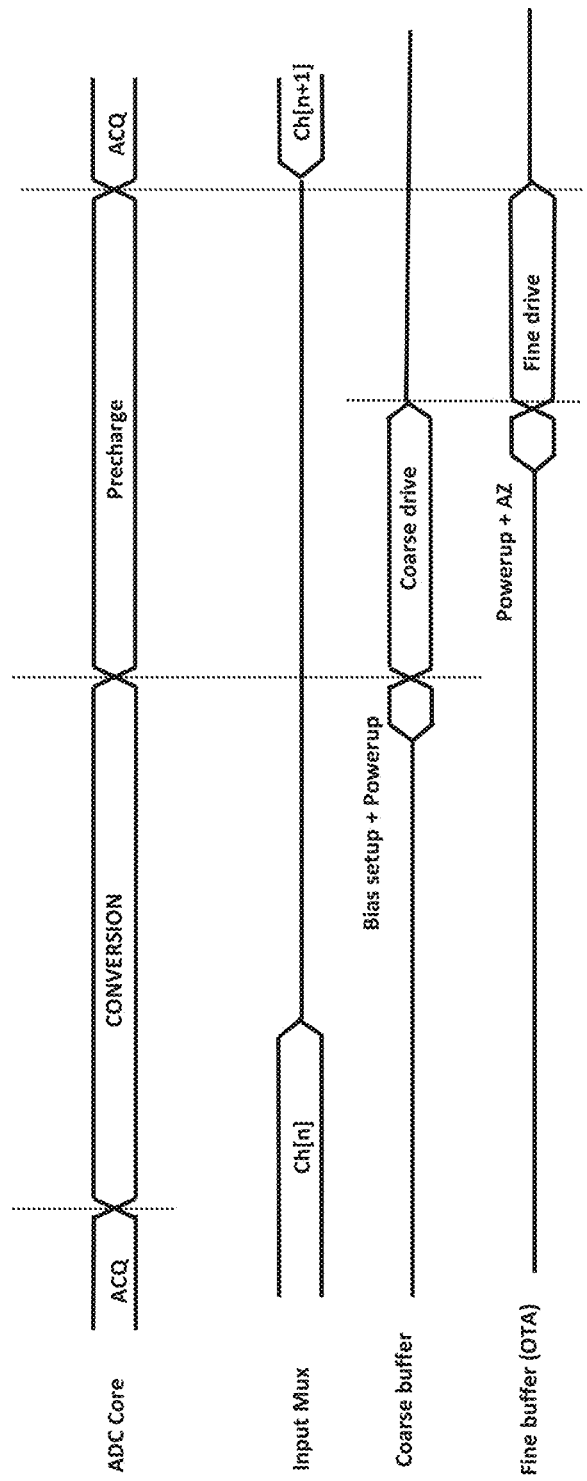
FIG. 11 is a timing diagram illustrating the timing of the operation of the third example of the disclosure.

The next phase of operation is shown in FIG. 5. Here, the capdac 44 has captured the previous sample and hence disconnects from the MUX output line (switch 442 turns off). As shown in FIG. 11, shortly after the end of the acquisition modes the MUX 42 stops outputting the previously selected (n−1th) channel, and the MUX output falls to the circuit low state, although the previous sample is still held on capacitor 444 of the capdac 44. The OTA 46 starts to power up and calibrates itself so as to auto-zero itself (s.13.6) but no pre-charging of the capdac input node yet occurs, so Cbat is not yet required, and all of switches 68, 70, 72, 74, and 78 stay in the same state they were in during the acquisition phase i.e. the OTA output is still disconnected from the MUX output/Capdac input line. However, on the input side of the OTA some of the switches relating to the MUX channel to be next output change state, as described below. For the parallel sets of switches relating to a MUX channel of the MUX42 which will not be the next selected channel no change occurs, and those sets of switches stay in the acquisition mode, with their capacitors 54 and 56 tracking their respective MUX inputs.

For the parallel set of switches relating to the MUX channel that will next be output to the capdac however (the nth channel), switches 58, 60, 62, and 66 change state, with the effect that the capacitors 54 and 56 are switched so as to be respectively in series with the input node and the respective inverting and non-inverting inputs of the OTA 46. That is, switch 62 turns off and switch 66 turns on to switch capacitor 54 in series between the input node 48 and the inverting input of the OTA, and switch 58 turns off and switch 60 turns on to switch the capacitor 56 in series between the input node 48 and the non-inverting input of the OTA. The effect of this switching is that this is the instant that the input for the chosen channel is actually sampled in the pre-charge circuitry, on the capacitors 54 and 56. However, because both capacitors 54 and 56 are connected at this time to the same input node 48, they both track the same selected input signal Vin[n], and hence the OTA, operating as a differential transconductance amplifier, sees the same signal on both of its inputs and provides no output at this time. Capacitors 54 and 56 continue to track the selected input signal Vin[n] throughout this state.

The operation then moves to the state shown in FIG. 6 for the channel in question (the other channels not being used remaining in acquisition mode), for pre-charge to begin to occur. In this respect, at this point the OTA is powered up and operating, and switch 50 turns off and switch 52 to turns on to disconnect capacitor 54 from the input node 48, and connect it to the MUX output line. This allows the capacitor 54 to sense the MUX output line, whilst capacitor 56 continues to sense the next input Vin[n], with the OTA then being controlled in dependence on the difference between the two signals. At this point, with reference to the timing diagram of FIG. 11, the pre-charge mode has just been entered, and MUX 42 will not presently be outputting any signal i.e. it is still in the quiescent stage where no output is provided between having output the n−1th sample, and the next nth sample, although capacitor 444 in the capdac 44 should still have charge corresponding to the previous n−1th sample. Hence, switches 52 and 50 turning on and off respectively connect the capacitor 54, which had been held at the Vin[n] voltage of the selected channel of the next nth sample onto the quiescent output line of the MUX 42 to which capacitor 444 holding the previous sample is connected, with the result that the MUX inverting input sees the difference between the previous n−1th samples held on capacitor 444 and the future nth sample held on capacitor 54, leading to OTA 46 beginning to see an increasing differential input signal on its inputs and hence begins to output current to charge the MUX output line.

In this respect, on the output side of the OTA switch 68 turns on to connect the OTA output to the MUX output line/capdac input, and switch 72 turns on and switch 74 turns off, to place Cbat 76 as a parallel load to the capdac 44 for the OTA. At this point, therefore, the OTA drives the output line of the MUX 42, via the on switch 68, with both the capdac 44 and the Cbat 76 as loads, to drive the MUX output line/capdac input up to the necessary signal level of the nth sample that will be output by the MUX as quickly as possible, thus reducing charge settling times. In this respect, as explained above, capacitor 54 connected to the inverting input of the OTA is connected to the output of the MUX via switch 52, and hence senses the MUX output, providing a control input signal for the OTA to drive the capdac to the MUX output level to be output.

At this point, therefore, the OTA has pre-charged the MUX output line/capdac input node as much as it is capable of. However, this may not have completely pre-charged the node to the desired signal level, as there may be extra signal swing necessary beyond the OTA's drive capability. To assist the OTA, therefore, the Cbat capacitor 76 is now brought into operation, as shown in FIG. 7 (s.13.10). Once the OTA-driven pre-charge is complete, switch 68 is turned off and switch 70 turned on. Switch 78 turns off so that the Cbat capacitor 76 is then placed in series with the OTA output and the capdac input node. The charge on the battery capacitor 76 helps to lift the OTA output above the OTA's drive capability, and hence cover any necessary extra pre-charge that may be required to bring the capdac to the MUX output signal level as quickly as possible.

Once the battery capacitor has finished charging the capdac, the left hand side of the input capacitor 54 and the left hand side of the capacitors in the capdac 44 are both accurately charged to the input signal being switched in from the MUX. This ensures that any back-gates or wells of the switches in the MUX are also pre-charged during this phase.

Once the top-up from the battery capacitor is complete the pre-charging process is complete, and the circuit moves back to the acquisition phase shown in FIG. 1, and the MUX outputs the nth sample for the switched capacitors in the capdac to acquire, for conversion. Hence, the acquisition—pre-charge for next acquisition—acquisition cycle can repeat from sample to sample.

As with the first example the second example provide numerous advantages. As described previously the provision of the respective capacitors 54 and 56 for each MUX input channel helps to take the burden of level shifting away from the OTA, allowing the OTA to work with similar signal levels from sample to sample, thus promoting stable and lower power operation. That is, when the OTA powers up it immediately sees the signal level of the next sample held on both the capacitors 54 and 56 at both of its inputs, and hence is not immediately required to output a signal, as there is no difference therebetween. However, once the capacitor 54 is switched to sense the MUX output line the OTA then begins to see a difference on its inputs and hence starts to output a pre-charge signal, but due to the capacitor 54 being charged to the signal on the selected nth channel output signal when this switching occurs the OTS does not see a step change on its inputs, thus saving it from large input signal swings. Moreover, the continued connection of the capacitor 56 to the nth channel output signal throughout the conversion phase means that the pre-charge circuit is always able to maintain the MUX 42 output line at the charge of the next nth output signal right up to the point of conversion, and hence faster operation is obtained, suitable for fast-moving signals from channel to channel.

In addition, the provision of the Cbat battery capacitor also helps to deal with large voltage swings from sample to sample by providing an effective charge reserve which can be drawn on to top up the pre-charge if the required charge is beyond the capability of the OTA to provide within the constraints of its power supply. Overall a more effective and lower power pre-charge circuit is obtained.

A third example embodiment will now be described, with respect to FIGS. 8a to 11, and FIG. 14. In this example the pre-charge phase is split into two periods, a first period when a coarse pre-charge is undertaken of the capacitive node (e.g. the Capdac input node) using a power efficient coarse buffer amplifier connected to the selected chosen input via an input circuit that mirrors the input tracking circuitry to the OTA in the previous example, followed by a second period when a fine pre-charge is undertaken by the OTA controlled by the same input tracking circuit as described in the previous embodiment. The general operation of this third example is therefore that the coarse buffer amplifier pre-charges the capacitive node of interest to about to the charge level of the signal next to be output from the MUX 42, and then the OTA 92, boosted by a series battery capacitor on its output, then conducts a fine pre-charge phase to take the capacitive node all the way to the charge level of the signal to be output from the MUX 42. This two stage operation can have several advantages over the previously described second example, in that the OTA 92 can be made to operate from a lower voltage power supply, as much of the pre-charging workload is done by the buffer amplifier. Provided this buffer amplifier is efficient, then overall power consumption for the whole pre-charge arrangement can be reduced. Further advantages will be described later, after the following detailed description of the example.

FIG. 8a shows a pre-charging circuit arrangement 90 according to the third example. Here, MUX 42 and the parallel sets of input circuitry for each MUX channel with each set comprising capacitors 54 and 56, input node 48, and switches 50, 52, 54, 58, 60, 62, 66, and power supply node 64 are identical to the second example described above, and hence will not be described again here. Within the third example, however, the OTA 92 may be different to the OTA 46 of the previous example, in that it may, in one variant, be fed with a lower voltage power supply, as the amount of pre-charging that it is required to do is less, as described above. However, in another variant of the third example, the OTA 92 may be fed with a 5 v supply, just like in the second example described previously.

Slight differences between the second example and third example also arise in the circuitry at the output of the OTA 92, and in particular by the removal of switch 68. Instead, therefore, switches 70, 72, 74, and 78 are retained, together with Cbat 94, with the switches and the Cbat connected in the same manner as in the second example. However, the removal of switch 68 means there is never any circuit path where the Cbat 94 is placed as a parallel load with the capacitive load of interest (i.e. the capdac 44), and instead the Cbat 94 is instead only ever switched into circuit in series with the capacitive load, to help boost the output of the OTA during the fine pre-charge phase. A final difference in this section of the circuitry is that the Cbat 94 itself may be different to the second example, in that a smaller Cbat 94 may be used in the third example than the Cbat 76 in the second example. The reason for this is that the Cbat 94 should only ever be required to aid the OTA 92 with topping up a very small residual error (typically less than 100 mV), and hence a smaller Cbat can be used.

The main difference between the third and second examples, however, arises in the provision of the coarse buffer amplifier 92c, and the input tracking circuitry thereto, that mirrors the input tracking circuitry to the OTA 92. That is, a plurality of parallel sets of input circuitry corresponding to the number of channels of the MUX 42 are provided, with each set comprising an input node 48c corresponding to a respective one of the MUX 42 input channels, the input node 48c being connected via capacitor 56c and switch 60c in series to the non-inverting input of amplifier 92c. Similarly, capacitor 54c of each parallel set is connected to the respective input node 48c via switch 50c, and to the inverting input of amplifier 92c via switch 62c. Also provided in each parallel set are switches 58c that connects the node between capacitor 56c and switch 60c to a low voltage supply, and switch 62c that connects the node between capacitor 54c and switch 62c also to a low voltage supply 64c. Finally, switch 52c acts as the MUX 42 output line sensing switch, and connects the node between capacitor 54c and switch 50c to the MUX 42 output line.

The coarse buffer amplifier 92c, which may be implemented as an efficient transistor based operational transconductance amplifier, receives the inverting and non-inverting inputs from switches 66c and 60c respectively and outputs a current in dependence on differences in signal on the two inputs, the output current signal being output via switch 100 to the capacitive node to be pre-charged, in this case the capdac 44, connected to the output line of MUX 42.

In operation the third example works as described next, with reference to FIGS. 8a to 11, and 14. Starting from FIG. 8a, let us assume that the capdac 44 is capturing the previous sample. In this case, the pre-charge circuitry is switched out from the MUX 42 output line, in that switches 100, 52, and 72 are all off. Capdac 44 input switch 442 is on, to allow the switched capacitor array 444 to sample the signal on the MUX 42 output line at the capdac 44 input node. As in the second embodiment, however, during acquisition the parallel sets of pre-charge circuitry on the input side of the OTA in both the coarse and fine pre-charge circuitry continue to operate to track their respective input channels Vin[1:16], in that capacitors 54 and 56 in each parallel set in the fine tracking circuit, and 54c and 56c in each parallel set in the coarse tracking circuit are all switched to connect at one side to the respective input nodes 48, 48c with switches 62 and 58 and 62c and 58c respectively switching the other sides of the capacitors to the local low voltage nodes 64 and 64c. In this respect, the operation of the input circuitry of the pre-charge is identical to that of the second example, taking into account the division into coarse and fine pre-charge circuitry.

Figure 14:
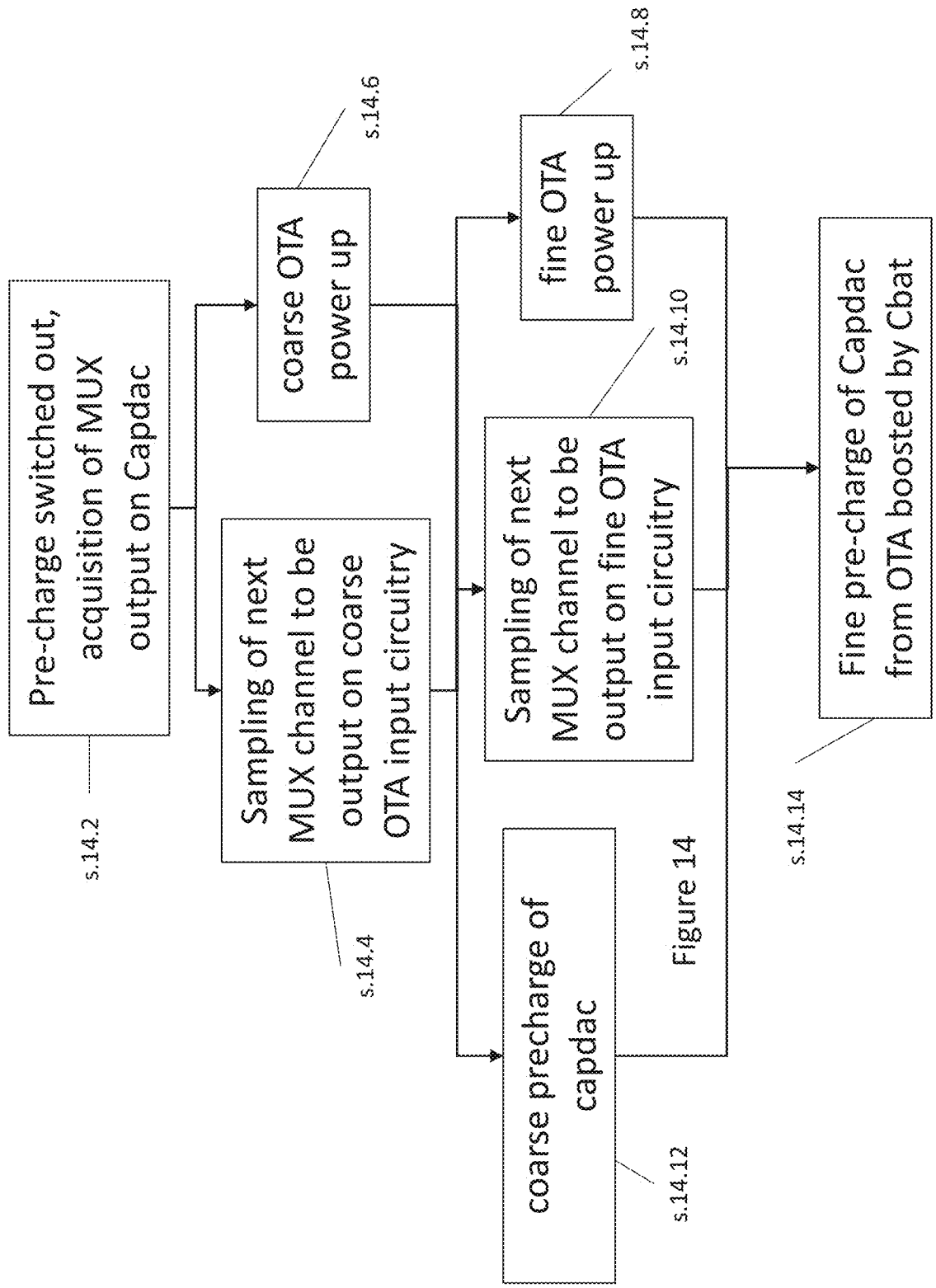
FIG. 14 is a flow diagram illustrating the operation of the third example described herein.

At the output side of the OTA, during acquisition the battery capacitor Cbat is switched via switches 74 and 78 to be placed between voltage supply 81 and low voltage node 83, where the voltage supply 81 is of a higher voltage (2.5 v, in this example), than the low voltage node 83, with the result that Cbat 94 accumulates charge during the acquisition phase. In the context of FIG. 14, all of the above is performed during step 14.2 thereof.

Figure 8B:
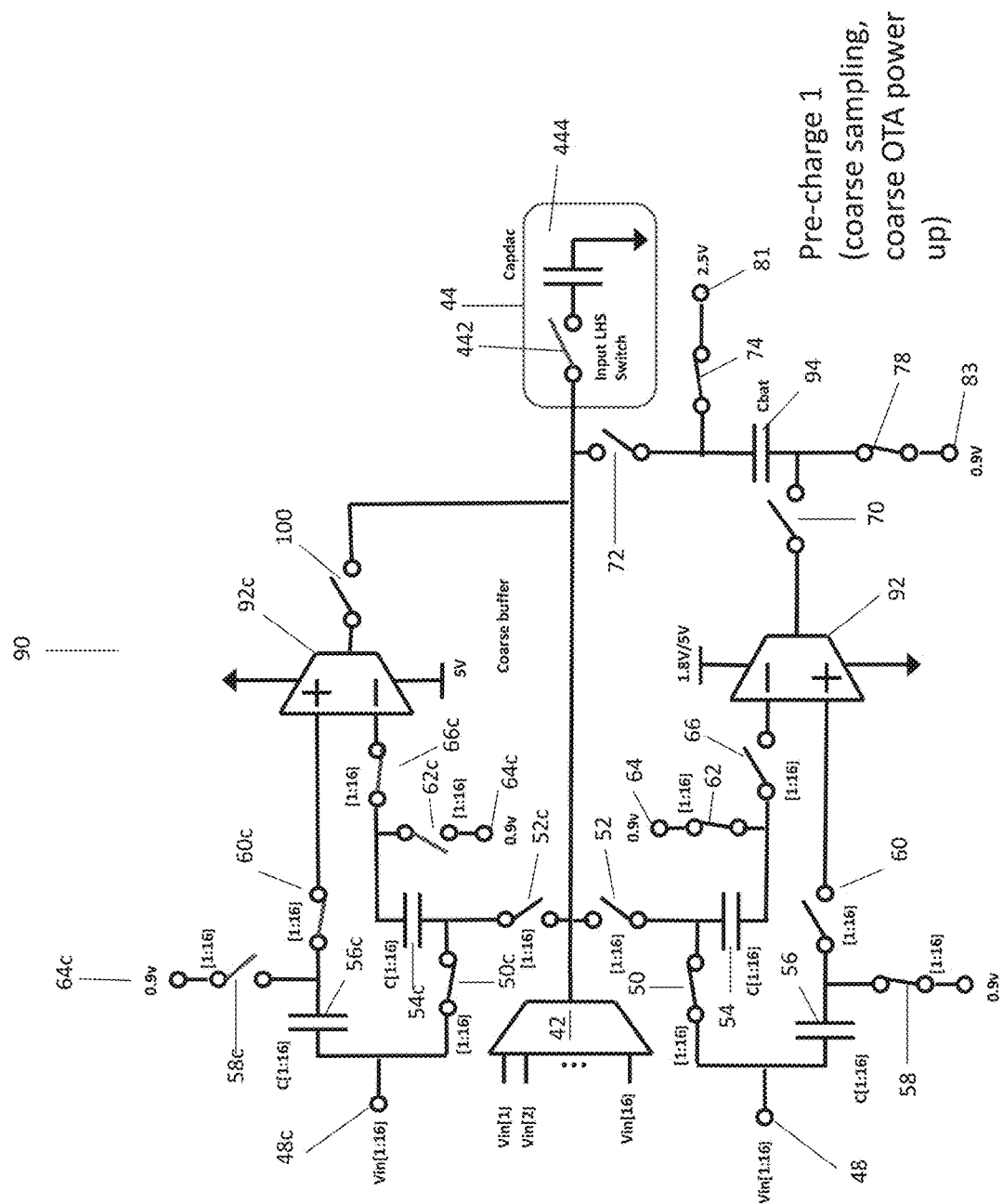
FIG. 8*b* is a circuit diagram of the third example of the present disclosure in a second mode of operation.

The next phase of operation is shown in FIG. 8b. This assumes that the capdac 44 has finished the previous acquisition phase, after which the capdac input switch 442 switches off to allow conversion to occur, as shown. Towards the end of conversion (see FIG. 11), the coarse buffer OTA 92c begins to power up and may auto-zero (s. 14.6), and capacitors 54c and 56c of the input channel that will next be output from MUX 42 are switched into series with the inverting and non-inverting inputs of the coarse OTA 92c, whilst still tracking and sampling their respective input 48c (s.14.4).

One point to note in this phase is that whilst the OTA 92c may undertake an auto-zero calibration process during power-up as described above, in an additional or alternative example such a calibration process may not be required, as the coarse buffer OTA 92c is not required to supply precision pre-charging signals. The reason for this is that the precision pre-charge is performed by the OTA 92 after the coarse pre-charge from OTA 92c has been performed, and hence precision pre-charging by OTA 92c is not required, all that is required is some degree of bulk pre-charge to move the charge on the capacitive node towards the desired level. Hence, in some examples the OTA 92c is not required to undertake any calibration or auto-zeroing during power-up, and the resulting relatively imprecise coarse pre-charge thus obtained is then compensated later by the fine pre-charge OTA 92 in the fine pre-charging phase.

Figure 9:
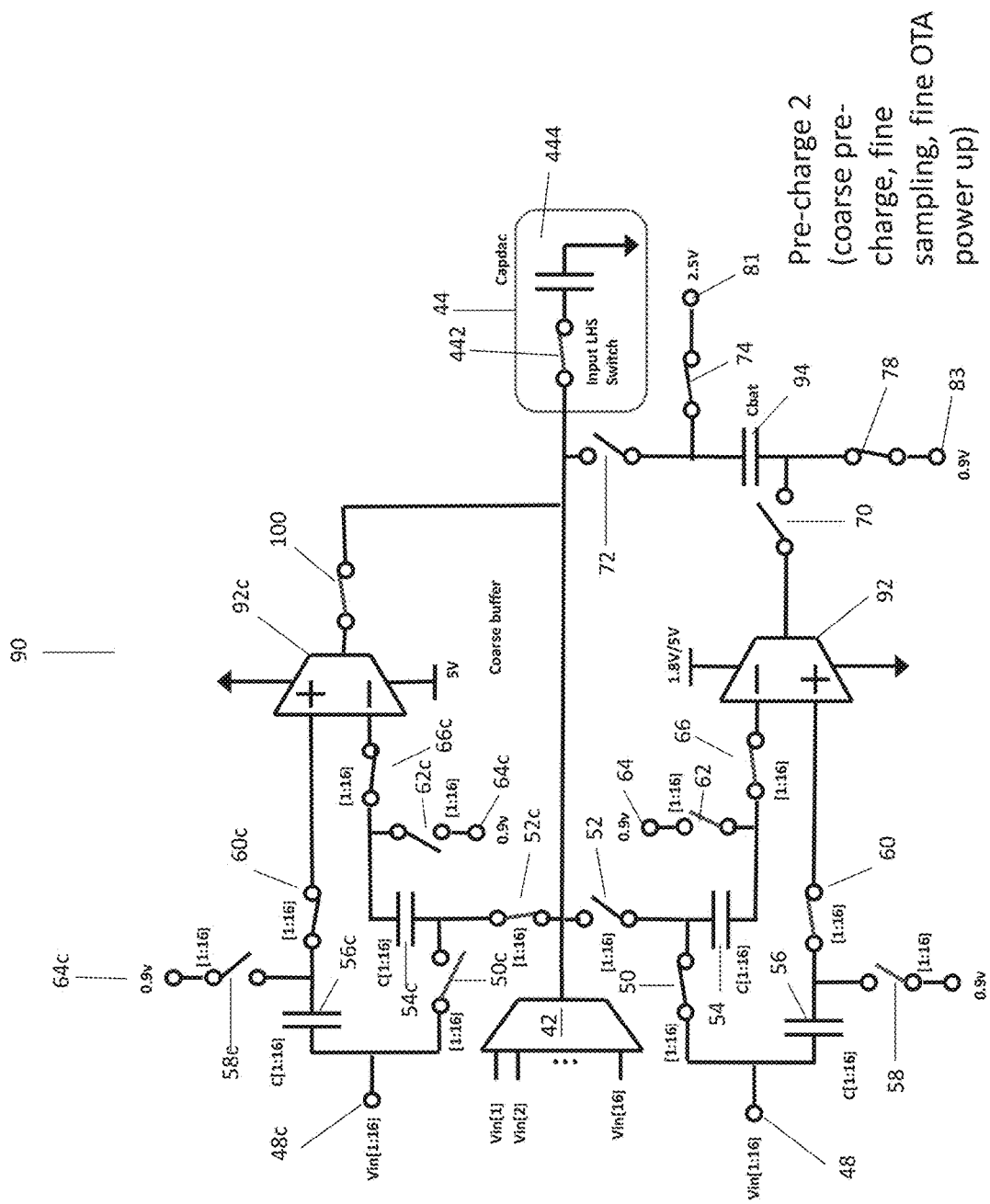
FIG. 9 is a circuit diagram of the third example of the present disclosure in a third mode of operation.

After OTA 92c powers up the operation then moves into the state shown in FIG. 9. Here, for the MUX channel that will next be output from the MUX, switch 50c of the parallel set of switches corresponding to that MUX channel turns off, and switch 52c turns on, so that capacitor 54c is then able to sense the MUX 42 output line. Switch 100 turns on, and capdac input switch 442 also turns on, so that capacitor 444 in the capdac is connected to the MUX output line. With such an arrangement, as with the previous embodiment, coarse OTA 92c senses the difference between the previous n−1th sample as held on capacitor 444 and the next nth sample as held on capacitor 56c which is still connected to the input node 48c and tracks the input voltage thereon, and begins to output a current signal to the MUX output line in dependence on the difference (s.14.12). Thus, with respect to the timing diagram of FIG. 11, at the point shown in FIG. 9 the pre-charge phase has begun, and specifically the coarse drive pre-charge phase shown, whilst the output from MUX 42 is low i.e. the next sample has yet to be output from MUX 42.

Within the input circuitry to the fine precharge OTA, at this same point shown in FIG. 9 the same operations happen as described in respect of the second embodiment. That is, the OTA begins to power up (s.14.8) and autozeroes, and switches 58, 60, 62, and 66 switch state in the particular set of circuitry corresponding to the next MUX channel to be output, so that the signal on that channel is sampled and begins to be fed to the OTA inputs (s.14.10). At the output of the OTA no change happens in the circuitry there, and the Cbat 94 continues to be charged between supply nodes 81 and 83.

Figure 10:
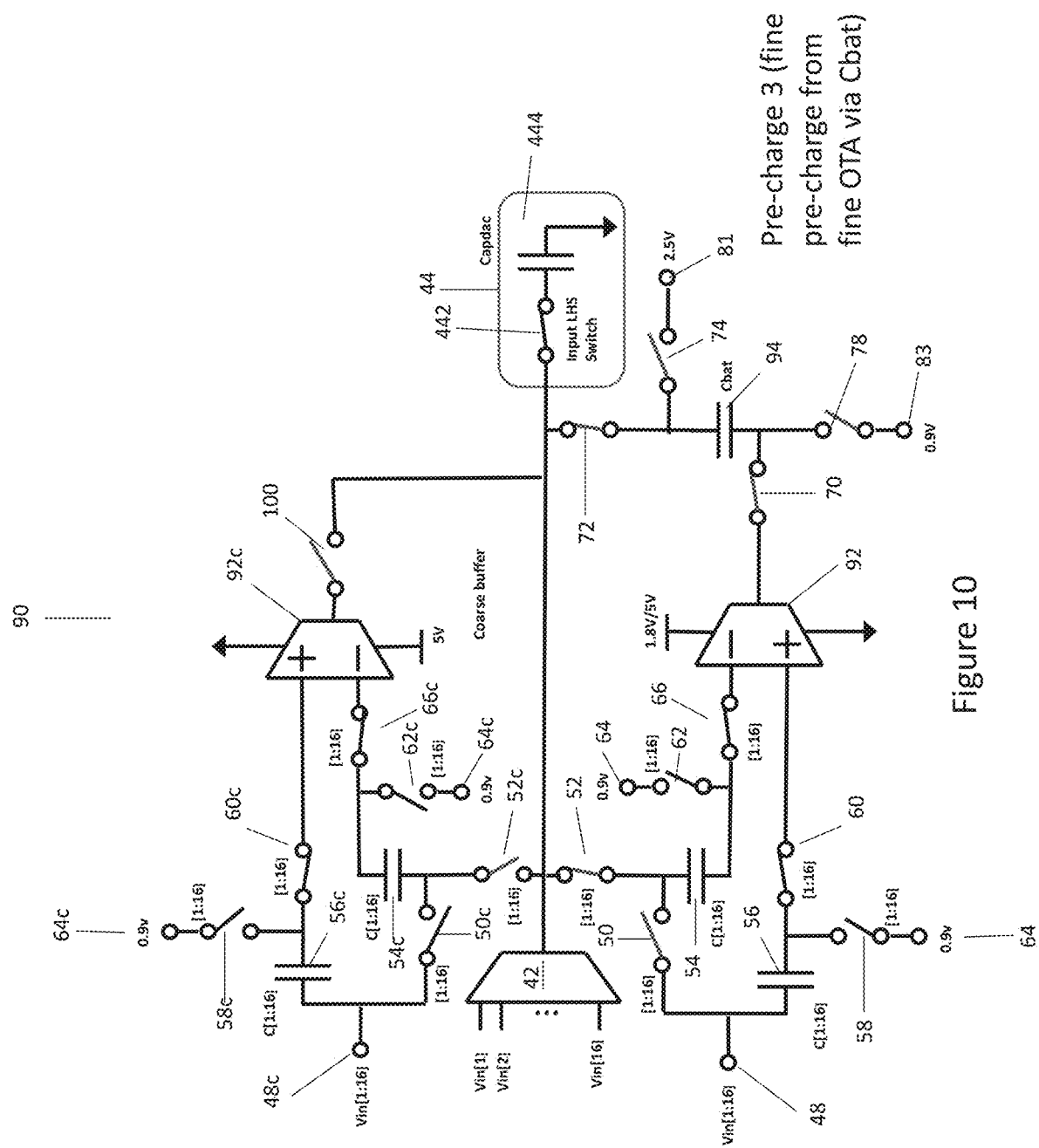
FIG. 10 is a circuit diagram of the third example of the present disclosure in a fourth mode of operation.

The next phase of operation is then shown in FIG. 10. In the context of the timing diagram of FIG. 11, the circuit state of FIG. 10 is assumed during the "fine drive" timing phase shown, after the "coarse drive" phase represented by the circuit state in FIG. 9. As shown in FIG. 10, during the fine drive phase the coarse buffer amplifier 92c is switched out of connection to the capdac input node, by switch 100 switching off. Instead, the coarse pre-charge is then replaced by the fine pre-charge operation of the OTA 92, which is almost identical to the OTA-led pre-charge operation of the second example. That is, switch 50 switches off and switch 52 switches on so that the OTA is then able to sense the MUX 42 output, and switches 70 and 72 switch on, and switches 74 and 78 switch off, so that the OTA output is fed, via switch 70, Cbat 94, and switch 72, to the capdac input node/MUX 42 output line, to complete the fine pre-charge of the node. In this respect, the Cbat 94 in this third example has already been charged via nodes 81 and 83 prior to being switched into series with the OTA output, and hence once switched into series with the OTA output the Cbat helps to boost the OTA output signal to help the OTA complete the fine pre-charge phase (s.14.14). Once the fine pre-charge phase has been completed the input node to the capdac and the MUX 42 output line should be fully pre-charged to the output signal of the MUX 42, and hence the circuitry can then move back to the acquisition phase shown in FIG. 8 (s.14.2) for acquisition by the capdac of the present sample being output by the MUX 42.

As noted above, the provision of the coarse buffer amplifier to conduct the bulk of the precharge, and the fine OTA circuit to complete the pre-charge during the fine precharge mode can result in lower power as long as the power consumed in the coarse buffer amplifier is small. However, there are further advantages over the coarse/fine precharge arrangement of the third example, in that a smaller Cbat may be used, and from the point of view of the fine OTA, when it is in operation it only ever sees one capacitive load, being that of the capacitive node it is to charge at the input of the capdac. In contrast, in the second example the single OTA sees a changing capacitive load, as it must first charge the Cbat in parallel with the load before the Cbat is then switched in series with it for the final top-up.

In addition, the operation of the fine OTA is more stable in the third example than the second example, as in addition to the capacitors 54 and 56 on its input, by the time the fine OTA is brought into operation there should only ever be a small residual pre-charge error, of the order of 100 mV or so, and hence the inputs to the fine OTA are predictable and should not be subject to any wild swings. As a result, the fine OTA can be designed and operated to deal with just the small predictable charge errors that remain on the MUX output line after the coarse pre-charge phase.

Conversely, the coarse buffer amplifier, which is also a transconductance amplifier, can also be designed and operated to deal with the coarse pre-charge phase that it needs to deal with, but knowing that precision operation is not required, and neither is it necessary to pre-charge across the whole signal range, as the fine pre-charge OTA and battery capacitor can be relied on for precision and final pre-charge top-up. As such a simpler, power efficient amplifier design which does not necessarily provide for precision operation may be used.

Figure 15:
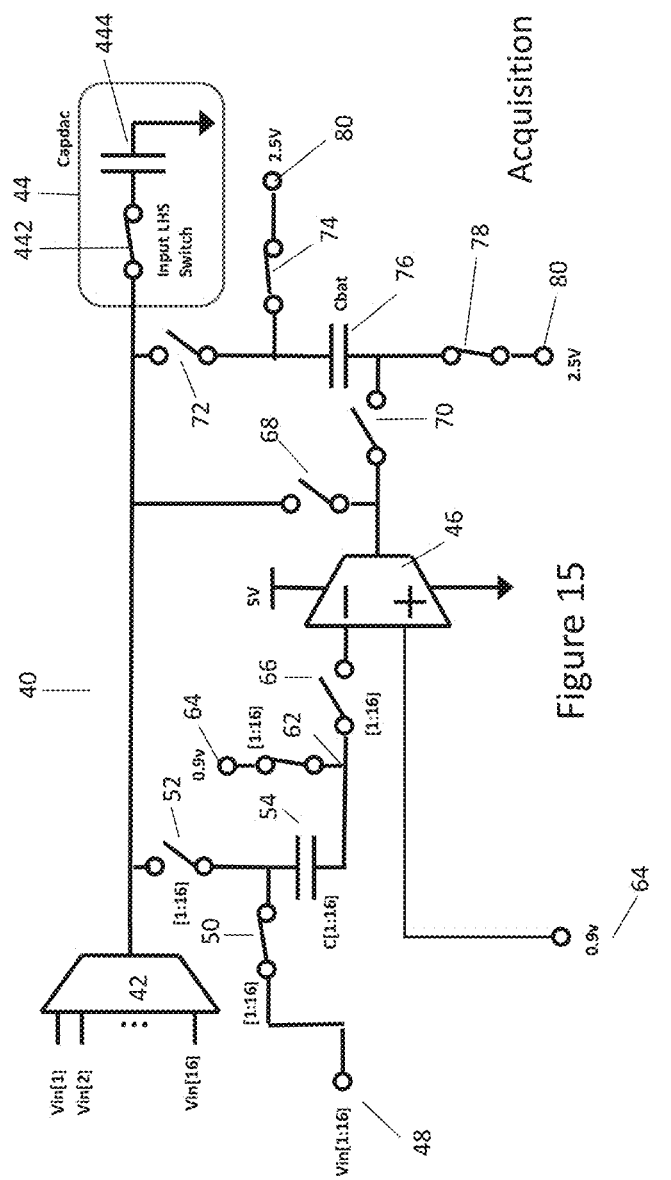
FIG. 15 is a circuit diagram of a fourth example of the present disclosure.

We now turn briefly to a fourth example, shown in FIG. 15. The fourth example provides a variant on the second example described above by virtue of a modification in the tracking circuitry at the input to the OTA 46, but the same modification may also be made to the coarse and fine pre-charge circuitry in the third example to provide further examples.

Within the fourth example the OTA input tracking circuitry is modified to remove capacitor 56, and switches 58 and 60, and instead to connect the non-inverting input of OTA 46 directly to the circuit low voltage node 64. The consequence of this is that the component count can be substantially reduced, as a capacitor and two switches are removed from each parallel set of input circuitry corresponding to the number of input channels to the MUX 42. The effect on the operation of the circuitry is that the next input channel is sampled by remaining capacitor 54 only up until the state shown in FIG. 6 when capacitor 54 switches to sense the MUX 42 output line, and pre-charging from the OTA starts to adjust the charge on the output line between the charge held on capacitor 444 in the capdac representing the last sample and that held on capacitor 54 representing the next MUX input channel to be output by the MUX 46, to get the charge on the output line to the signal level of the next MUX input channel to be output. Any changes to the next MUX input channel to be output after this time and before the channel is actually output are not sensed, and no pre-charge is undertaken in respect thereof. However, provided that the possible signals that might be output from the MUX are relatively slow moving in the time period between the start and end of pre-charging i.e. during the pre-charging period, then such a compromise is acceptable to reduce component count in the circuitry.

In all of the above examples we have referred to various switches, which may be switched on or off, or "opened" (turned off) or "closed" (turned on). Of course, it will be understood that the switches in the described circuitry will typically be implemented as suitably controlled transistors with most of the switches in the circuits being implemented as regular NMOS, PMOS, or T-gate transistor switches. Some of the switches, particularly switches 52, 72, and 100 that connect to the MUX output line may be gate boosted NMOS transistors, whilst switch 50 may be a combination of an NMOS transistor in series with a gate boosted PMOS transistor. Other transistor based switches may of course be used in implementations of the described circuitry.

Various further modifications, whether by way of addition, deletion, or substitution may be made to the above mentioned examples to provide further examples, any and all of which are intended to be encompassed by the appended claims.

What is claimed is:

1. A signal routing circuit having pre-charge circuitry for pre-charging a capacitive load to which a multiplexer provides a signal, the signal routing circuit comprising:
   a multiplexer having a plurality of input channels and an output channel;
   a capacitive load at or connectable to the output channel of the multiplexer; and
   pre-charge circuitry arranged to pre-charge the capacitive load in dependence on a signal on capacitive load, before said signal on said one of the input channels is routed to the capacitive load via the multiplexer, the pre-charge circuitry further comprising:
   a first amplifier arranged to output a first current to the capacitive load to pre-charge the load; and
   a plurality of capacitors respectively switchable to, and configured to track, separately from the multiplexer, corresponding ones of the plurality of input channels to the multiplexer, the plurality of capacitors being selectively switchable during a pre-charging phase to an input of the first amplifier to provide an amplifier input signal dependent on a difference between an output voltage of the multiplexer and a voltage of a particular one of the input channels of the multiplexer to be next output from the multiplexer, wherein based on said amplifier input signal the first amplifier provides the output to the capacitive load and pre-charges the capacitive load.

2. A signal routing circuit according to claim 1, wherein a respective capacitor samples the signal on the particular one of the input channels of the multiplexer to be next output from the multiplexer and is switched into series with the first amplifier input.

3. A signal routing circuit according to claim 1, wherein one or more capacitors are provided respectively per input channel to the multiplexer, the one or more capacitors per channel being switchable via switching circuitry so as to track respectively the input channels of the multiplexer.

4. A signal routing circuit according to claim 3, where a first capacitor per input channel is connectable via the switching circuitry:
   i) in a first phase of operation, to the respective multiplexer input channel; and
   ii) in a second phase of operation, to the multiplexer output channel and a first input of the first amplifier.

5. A signal routing circuit according to claim 4, wherein, in the first phase of operation the capacitor tracks the respective multiplexer input channel to be next output, and hence the first amplifier outputs no pre-charging signal to the capacitive load, and in the second phase of operation the capacitor tracks the multiplexer output channel, the first amplifier outputs the pre-charging signal in dependence on a difference in signal between the multiplexer output channel and the respective multiplexer input channel to be next output.

6. A signal routing circuit according to claim 1, and further comprising a battery capacitor switchable into series between the output of the first amplifier and the capacitive load.

7. A signal routing circuit according to claim 6, and further comprising a second amplifier and second switching circuitry arranged to:
   i) in a third phase of operation, switch the battery capacitor so as to provide a parallel load to the capacitive load to the first or the second amplifier, wherein to permit the first or the second amplifier to charge the battery capacitor in parallel with the capacitive load;
   ii) in a fourth phase of operation, switch the battery capacitor in series between the first amplifier output and the capacitive load, wherein to permit the battery capacitor to supplement the amplifier output signal to pre-charge the capacitive load.

8. A signal routing circuit according to claim 6; and further comprising second switching circuitry arranged to:
  i) in a third phase of operation, switch the battery capacitor in series between the first amplifier output and the capacitive load, wherein to permit the battery capacitor to supplement the first amplifier output signal to pre-charge the capacitive load.

9. A signal routing circuit according to claim 1, and further comprising:
  second pre-charge circuitry arranged in use to pre-charge the capacitive load in dependence on a signal on one of the input channels to the multiplexer to be next output to the capacitive load, the second pre-charge circuitry further comprising:
  a second amplifier arranged to provide a second pre-charging signal to the capacitive load to pre-charge the load;
  a plurality of capacitors switchable so as to track respectively the plurality of input channels to the multiplexer; and
  second switching circuitry controllable to switch into series with the second amplifier input the respective capacitor that tracks the input channel to the multiplexer to be next output.

10. A signal routing circuit according to claim 9, wherein the second amplifier provides the second pre-charging signal to the capacitive load before the first amplifier provides the first pre-charging signal to the capacitive load.

11. A signal routing circuit according to claim 10, wherein the second pre-charging signal is larger than the first pre-charging signal; whereby a two-stage pre-charging operation is obtained.

12. A signal routing circuit having pre-charge circuitry for pre-charging a capacitive load to which a multiplexer provides a signal, the signal routing circuit comprising:
  a multiplexer having a plurality of input channels and an output channel;
  a capacitive load connectable to the output channel of the multiplexer; and
  pre-charge circuitry arranged to pre-charge the capacitive load in dependence on a signal on one of the input channels to the multiplexer to be next output to the capacitive load, before said signal on said one of the input channels is routed to the capacitive load via the multiplexer, the pre-charge circuitry further comprising:
  a first amplifier arranged to output a first current to the capacitive load to pre-charge the load;
  a plurality of capacitors respectively switchable to, and configured to track, separately from the multiplexer, corresponding ones of the plurality of input channels to the multiplexer, the plurality of capacitors being selectively switchable during a pre-charging phase to an input of the first amplifier to provide an amplifier input signal dependent on a difference between an output voltage of the multiplexer and a voltage of a particular one of the input channels of the multiplexer to be next output from the multiplexer, wherein based on said amplifier input signal the first amplifier provides the output to the capacitive load and pre-charges the capacitive load;
  and
  a battery capacitor switchable into series between an output of the first amplifier and the capacitive load to provide a top-up pre-charging signal to the capacitive load.

13. A signal routing circuit according to claim 12, and further comprising switching circuitry arranged to:
  i) in a first phase of operation, switch the battery capacitor so as to provide a parallel load to the capacitive load to the first amplifier, wherein to permit the first amplifier to charge the battery capacitor in parallel with the capacitive load;
  ii) in a second phase of operation, switch the battery capacitor in series between the first amplifier output and the capacitive load, wherein to permit the battery capacitor to supplement the amplifier output signal to pre-charge the capacitive load.

14. A signal routing circuit according to claim 12, and further comprising switching circuitry arranged to switch the battery capacitor in series between the first amplifier output and the capacitive load, wherein to permit the battery capacitor to supplement the first amplifier output signal to pre-charge the capacitive load.

15. A signal routing circuit according to claim 14, and further comprising:
  second pre-charge circuitry arranged in use to pre-charge the capacitive load in dependence on a signal on one of the input channels to the multiplexer to be next output to the capacitive load, the second pre-charge circuitry further comprising:
  a second amplifier arranged to provide a second pre-charging signal to the capacitive load to pre-charge the load.

16. A signal routing circuit according to claim 15, wherein the second amplifier provides the second pre-charging signal to the capacitive load before the first amplifier provides the first pre-charging signal to the capacitive load.

17. A signal routing circuit according to claim 16, wherein the second pre-charging signal is larger than the first pre-charging signal, whereby a two-stage pre-charging operation is obtained.

18. A method of operating a signal routing circuit having pre-charging circuitry for pre-charging a capacitive load to which a first multiplexer provides a signal, the method comprising:
  a) tracking, via a plurality of respective capacitors the signals on a plurality of input channels to the first multiplexer, the plurality of respective capacitors respectively switchably connected to, separately from the multiplexer, the plurality of input channels;
  b) selecting one of the input channels to be next output by the first multiplexer, and feeding, via the respective capacitor(s) that track(s) the selected channel, the signal on the selected channel to a first amplifier;
  c) generating, in the first amplifier, a first pre-charge signal in dependence on the signal received at the first amplifier via the respective capacitor(s) to pre-charge the capacitive load separately from the multiplexer before the next to be selected input channel is routed to the capacitive load via the multiplexer; and
  d) feeding the first pre-charge signal to the capacitive load to pre-charge the capacitive load prior to the selected input channel being output by the first multiplexer;
wherein the plurality of capacitors is selectively switchable durino a pre-charging phase to an input of the first amplifier to provide an amplifier input signal dependent on a difference between an output voltage of the multiplexer and a voltage of a particular one of the input channels of the multiplexer to be next output from the multiplexer, wherein based on said amplifier input signal the first amplifier provides the output to the capacitive load and pre-charges the capacitive load.

19. A method according to claim 18, and further comprising:
   e) generating, in a second amplifier, a second pre-charge signal in dependence on a signal received at the second amplifier corresponding to the signal on the selected channel to be next output by the first multiplexer; and
   f) feeding the second pre-charge signal to the capacitive load to pre-charge the capacitive load prior to the first pre-charge signal being fed to the capacitive load;
   wherein the second pre-charge signal is larger than the first pre-charge signal, whereby a coarse pre-charge of the capacitive load is obtained followed by a fine pre-charge.

20. A signal routing circuit according to claim 4, wherein a second capacitor per input channel is connectable via the switching circuitry:
   i) in a first phase of operation to the respective multiplexer input channel; and
   ii) in a second phase of operation, to the respective multiplexer input channel and to a second input of the first amplifier.

21. A signal routing circuit according to claim 1, wherein the plurality of capacitors is configured to provide a corresponding level-shifted representation of the difference between the output voltage of the multiplexer and the voltage of the particular one of the input channels of the multiplexer to be next output by the multiplexer to an input of the first amplifier, based on which the first amplifier pre-charges the capacitive load.

22. A signal routing circuit according to claim 12, wherein the plurality of capacitors is configured to provide a corresponding level-shifted representation of the difference between the output voltage of the multiplexer and the voltage of the particular one of the input channels of the multiplexer to be next output by the multiplexer to an input of the first amplifier, based on which the first amplifier pre-charges the capacitive load.

23. A method according to claim 18, wherein the plurality of capacitors is configured to provide a corresponding level-shifted representation of the difference between the output voltage of the multiplexer and the voltage of the particular one of the input channels of the multiplexer to be next output by the multiplexer to an input of the first amplifier, based on which the first amplifier pre-charges the capacitive load.

* * * * *

UNITED STATES PATENT AND TRADEMARK OFFICE
CERTIFICATE OF CORRECTION

PATENT NO. : 10,931,122 B2
APPLICATION NO. : 15/375906
DATED : February 23, 2021
INVENTOR(S) : Hurrell et al.

Page 1 of 1

It is certified that error appears in the above-identified patent and that said Letters Patent is hereby corrected as shown below:

On the Title Page

In item (71), in "Applicant", in Column 1, Line 2, delete "Hamilton (BM)" and insert --Limerick (IE)-- therefor In the Claims In Column 17, Line 1, in Claim 8, delete "claim 6;" and insert --claim 6,-- therefor In Column 17, Line 32, in Claim 11, delete "signal;" and insert --signal,-- therefor In Column 18, Line 60, in Claim 18, delete "durino" and insert --during-- therefor Signed and Sealed this
Eighteenth Day of May, 2021

Drew Hirshfeld
*Performing the Functions and Duties of the
Under Secretary of Commerce for Intellectual Property and
Director of the United States Patent and Trademark Office*